(12) United States Patent
Kim et al.

(10) Patent No.: US 10,371,874 B2
(45) Date of Patent: Aug. 6, 2019

(54) SUBSTRATE UNIT OF NANOSTRUCTURE ASSEMBLY TYPE, OPTICAL IMAGING APPARATUS INCLUDING THE SAME, AND CONTROLLING METHOD THEREOF

(71) Applicant: YONSEI UNIVERSITY, UNIVERSITY—INDUSTRY FOUNDATION (UIF), Seoul (KR)

(72) Inventors: Donghyun Kim, Seoul (KR); Wonju Lee, Ansan-si (KR); Hongki Lee, Seoul (KR); Taehwang Son, Seoul (KR)

(73) Assignee: YONSEI UNIVERSITY, UNIVERSITY—INDUSTRY FOUNDATION (UIF), Seoul (KR)

( * ) Notice: Subject to any disclaimer, the term of this patent is extended or adjusted under 35 U.S.C. 154(b) by 19 days.

(21) Appl. No.: 15/626,778

(22) Filed: Jun. 19, 2017

(65) Prior Publication Data
US 2017/0363967 A1 Dec. 21, 2017

(30) Foreign Application Priority Data

Jun. 20, 2016 (KR) .................. 10-2016-0076782
May 31, 2017 (KR) .................. 10-2017-0067950

(51) Int. Cl.
*H01L 21/68* (2006.01)
*G02B 5/00* (2006.01)
(Continued)

(52) U.S. Cl.
CPC .............. *G02B 5/008* (2013.01); *C08K 3/08* (2013.01); *G01Q 60/22* (2013.01); *G02B 3/005* (2013.01);
(Continued)

(58) Field of Classification Search
CPC ....... H01L 21/68; H01L 21/681; G02B 3/005; G02B 5/008; G02B 6/1226;
(Continued)

(56) References Cited

U.S. PATENT DOCUMENTS 9,019,599 B2 * 4/2015 Kim .................... G01N 21/648
250/227.18
9,739,710 B2 * 8/2017 Schubert ............... G01N 21/23
(Continued)

FOREIGN PATENT DOCUMENTS

JP 2007526439 9/2007
JP 2009199990 9/2009
(Continued)

OTHER PUBLICATIONS

Extraordinary Transmission-based Plasmonic Nanoarrays for Axially Super-Resolved Cell Imaging, (Copyright 1999-2017), pp. 1-3, Retrieved from the Internet Jun. 19, 2017, <http://onlinelibrary.wiley.com/doi/10.1002/adom.201300330/abstract>.

*Primary Examiner* — Stephen W Smoot
(74) *Attorney, Agent, or Firm* — Cantor Colburn LLP

(57) ABSTRACT

The present disclosure relates to a substrate unit of a nanostructure assembly type, an optical image apparatus including the same, and a controlling method thereof, and the substrate unit of the nanostructure assembly type according to an exemplary embodiment includes: a lower substrate; an upper substrate separated from the lower substrate, an observation object being able to be positioned at the upper substrate; and at least one metal nanostructure positioned on the lower substrate, wherein the at least one metal nanostructure is capable of being assembled on the lower substrate or separated from the lower substrate.

16 Claims, 6 Drawing Sheets

(51) Int. Cl.
*G01Q 60/22* (2010.01)
*G02B 3/00* (2006.01)
*C08K 3/08* (2006.01)
*G02B 6/122* (2006.01)
*B82Y 20/00* (2011.01)
*B82Y 40/00* (2011.01)

(52) U.S. Cl.
CPC .......... *G02B 6/1226* (2013.01); *H01L 21/681* (2013.01); *B82Y 20/00* (2013.01); *B82Y 40/00* (2013.01); *G02B 2207/101* (2013.01); *Y10S 977/868* (2013.01); *Y10S 977/882* (2013.01)

(58) Field of Classification Search
CPC .. G02B 21/0036; G02B 21/02; G02B 21/248; G02B 21/26; G02B 2207/101; G01Q 60/22; B82B 3/0004; B82Y 20/00; B82Y 40/00; Y10S 977/81; Y10S 977/868; Y10S 977/869; Y10S 977/881; Y10S 977/882; Y10S 977/888
See application file for complete search history.

(56) References Cited

U.S. PATENT DOCUMENTS

| | | | | |
|---|---|---|---|---|
| 2007/0258880 | A1* | 11/2007 | Murakoshi | B82Y 15/00 423/447.1 |
| 2011/0318695 | A1* | 12/2011 | Hwang | B82Y 30/00 430/322 |
| 2012/0327417 | A1* | 12/2012 | Amako | G01N 21/658 356/445 |
| 2016/0341946 | A1* | 11/2016 | Wenger | G02B 21/361 |
| 2017/0074760 | A1* | 3/2017 | Iida | C12M 35/02 |
| 2018/0299458 | A1* | 10/2018 | Gerion | B01J 13/02 |

FOREIGN PATENT DOCUMENTS

| | | |
|---|---|---|
| KR | 1020100018797 A | 2/2010 |
| KR | 1020100096874 A | 9/2010 |
| KR | 101084018 | 11/2011 |
| KR | 1020120020848 A | 3/2012 |
| KR | 101198476 | 11/2012 |

\* cited by examiner

- Prior Art -

SUBSTRATE UNIT OF NANOSTRUCTURE ASSEMBLY TYPE, OPTICAL IMAGING APPARATUS INCLUDING THE SAME, AND CONTROLLING METHOD THEREOF

CROSS-REFERENCE TO RELATED APPLICATION

This application claims priority to and the benefit of Korean Patent Application No. 10-2016-0076782 filed in the Korean Intellectual Property Office on Jun. 20, 2016, and Korean Patent Application No. 10-2017-0067950 filed in the Korean Intellectual Property Office on May 31, 2017 the entire contents of which are incorporated herein by reference.

BACKGROUND

(a) Technical Field

The present invention relates to a substrate unit of a nanostructure assembly type and an optical image apparatus including the same. More particularly, the present invention relates to a substrate unit of a nanostructure assembly type that generates a local electric field, and an optical image apparatus including the same.

(b) Description of the Related Art

A human desire to observe very small things that cannot be seen by the naked human eye led to the invention of an optical apparatus called a microscope, and because of the ongoing craving to see the unseen world, research to improve the resolution of the microscope is continuing. Wide-field microscopy induces enlargement of an observation object through an optical arrangement of lenses, however the observation of a material having a size of an approximate 200-300 nm range or less or distinction between different materials existing within a distance of an approximate 200-300 nm range is virtually impossible because of an optical aberration of the lens and an Abbe diffraction limit in a high magnification environment.

Although the current technology proposed as an alternative to the optical microscope electron microscopy, for observation of the sample with an electron microscope, a pretreatment process for the sample prior to the observation is required. For example, a surface of the sample should be coated with a metal or moisture within the sample should all be removed. Therefore, it is practically impossible to analyze images and motions of living cellular substances using the electron microscope.

Accordingly, a method of indirectly observing a fluorescence signal excited by an incident light source by dying a phosphor to the sample to be observed is being researched, and there are epiflourescence microscopy, total internal fluorescence microscopy, and confocal microscopy as kinds of this fluorescent microscopy.

However, the fluorescent microscopy also has a limit in resolution in a horizontal direction, and accordingly a technology using a plasmonic phenomenon by a metal nanostructure has been recently emerging. In the metal nanostructure, a plasmon as similar particles in which free electrons in the metal collectively oscillate exists, and in this case, a phenomenon that an electric field (a local electric field) is locally greatly increased as electromagnetic waves to a near infrared band from visible light and the plasmon are combined is called a plasmonic phenomenon.

Korean Patent Laid-Open Publication No. 2015-0114262 is a paper related thereto.

The above information disclosed in this Background section is only for enhancement of understanding of the background of the invention and therefore it may contain information that does not form the prior art that is already known in this country to a person of ordinary skill in the art.

SUMMARY

The present invention provides a substrate unit of a nanostructure assembly type in which an observation object does not directly contact the metal nanostructure, and in which the metal nanostructure of various shapes is able to be assembled or separated, an optical image apparatus including the same, and a controlling method thereof.

A substrate unit of a nanostructure assembly type according to an exemplary embodiment of the present invention includes: a lower substrate; an upper substrate separated from the lower substrate, an observation object being able to be positioned at the upper substrate; and at least one metal nanostructure positioned on the lower substrate, wherein the at least one metal nanostructure is capable of being assembled on the lower substrate or separated from the lower substrate.

The substrate unit of a nanostructure assembly type may further include at least one block positioned between each of the at least one metal nanostructure and the lower substrate, the at least one block capable of being separated from the lower substrate or assembled to the lower substrate along with the metal nanostructure.

A main surface of the lower substrate may be divided into a plurality of regions, and each of the at least one metal nanostructure may be positioned in each different region of the plurality of regions.

The plurality of regions may be arranged in a matrix shape.

The at least one metal nanostructure may be provided in a plurality of metal nanostructures, and different metal nanostructures among the plurality of metal nanostructures may be separated from each other on the lower substrate.

A relative position between the upper substrate and the lower substrate may be controllable.

An optical image apparatus according to an exemplary embodiment of the present invention includes: a lower substrate including a main surface perpendicular to a first direction; an upper substrate separated from the lower substrate, an observation object being able to be positioned at the upper substrate; at least one metal nanostructure positioned on the lower substrate; a position controller for controlling at least one position of the upper substrate and the lower substrate; and a light source positioned under the lower substrate and for irradiating light to the lower substrate, wherein the position controller controls a position of at least one of the lower substrate and the upper substrate in a second direction perpendicular to the first direction.

The at least one metal nanostructure may be capable of being assembled on the lower substrate or separated from the lower substrate.

The position controller may be capable of controlling a distance between the upper substrate and the lower substrate in the first direction within a depth range of a local electric field formed by the metal nanostructure.

A main surface of the lower substrate may be divided in a plurality of regions, and each of the at least one metal nanostructure may be positioned in each different region of the plurality of regions.

The plurality of regions may be arranged in a matrix shape.

The at least one metal nanostructure may be provided in a plurality of metal nanostructures, and different metal nanostructures among the plurality of metal nanostructures may be separated from each other on the lower substrate.

The position controller may control a position of the upper substrate or the lower substrate according to a control signal so that one among the plurality of regions faces the observation object.

The optical image apparatus may further include at least one block positioned between the at least one metal nanostructure and the lower substrate, the at least one block capable of being separated from the lower substrate or assembled to the lower substrate along with the at least one metal nanostructure.

According to an exemplary embodiment, a controlling method of an optical image apparatus including a lower substrate, an upper substrate, and a position controller includes: separating the upper substrate at which an observation object is positioned and the lower substrate from each other by a first distance according to a replacement requirement control signal; assembling or separating at least one metal nanostructure on or from the lower substrate; and controlling a distance between the upper substrate and the lower substrate within a second distance smaller than the first distance according to an observation requirement control signal, wherein the second distance is determined depending on a depth of a local electric field formed by the metal nanostructure.

The controlling method may further include controlling a position of the upper substrate or the lower substrate according to the observation requirement control signal so that one among the at least one metal nanostructure is positioned under the observation object.

According to embodiments of the present invention, a position of a local electric field formed at the observation object may be controlled and the image acquisition for the entire region of the observation object is possible.

Also, the user may obtain the image for the observation object by positioning the plurality of metal nanostructures of various shapes on the lower substrate according to an observation object or an observation environment, and because the plurality of metal nanostructures may be positioned on the lower substrate, the inconvenience of replacement of the metal nanostructure may be alleviated.

DETAILED DESCRIPTION OF THE EMBODIMENTS

Figure 1:
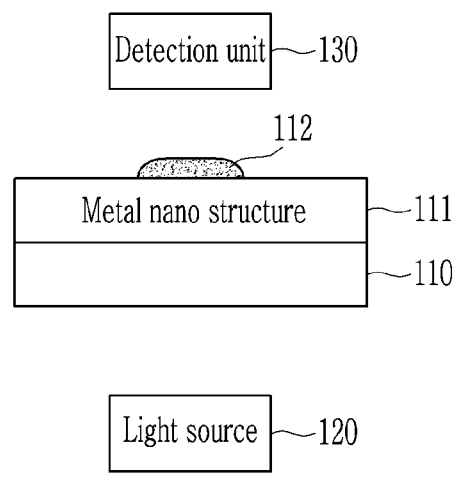
FIG. 1 is a side view of an optical image apparatus according to a conventional art using a plasmonic phenomenon.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

Descriptions of parts not related to the present invention are omitted, and like reference numerals designate like elements throughout the specification.

Further, since sizes and thicknesses of constituent members shown in the accompanying drawings are arbitrarily given for better understanding and ease of description, the present invention is not limited to the illustrated sizes and thicknesses. In the drawings, the thickness of layers, films, panels, regions, etc., are exaggerated for clarity. In the drawings, for better understanding and ease of description, the thicknesses of some layers and areas are exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

In addition, unless explicitly described to the contrary, the word "comprise" and variations such as "comprises" or "comprising" will be understood to imply the inclusion of stated elements but not the exclusion of any other elements.

Now, exemplary embodiments according to the present invention will be described in detail with reference to accompanying drawings.

FIG. 1 is a side view of a general optical image apparatus according to a conventional art using a plasmonic phenomenon.

A metal nanostructure 111 is disposed on one surface of a transparent substrate 110, and an observation object 112 is positioned on the metal nanostructure 111. That is, the observation object 112 is in direct contact with the metal nanostructure 111.

Light irradiated from a light source 120 positioned under the substrate 110 is incident to the substrate 110, and a local electric field (a hot spot) is formed by the metal nanostructure 111.

A phosphor included in the observation object 112 emits light in response to the local electric field, and a detection unit 130 obtains an image of the observation object 112 using the emitted light.

In the case of the optical image apparatus according to the conventional art, because the observation object 112 is positioned on the metal nanostructure 111, and the observation object 112 is not moved over the metal nanostructure 111, there is a problem that it is difficult to obtain an image for a part of the observation object 112 where the local electric field formed by the metal nanostructure 111 is not positioned.

Also, in the conventional art, because the metal nanostructure 111 of one kind may only be used for one observation object 112, there is a problem that an observation position in a longitudinal axis direction in a specific position is fixed, and that it is inconvenient to replace the nanostructure every time when using a nanostructure of other kinds.

The present invention is to solve the above-described problems, and uses an upper substrate on which the observation object is positioned, and a lower substrate on which a metal nanostructure is positioned. In a state that the upper substrate and the lower substrate are separated, the positions of the upper substrate and the lower substrate may be relatively controlled.

Accordingly, according to embodiments of the present invention, the observation object is not directly positioned on the metal nanostructure, the position of the local electric field formed at the observation object may be controlled by controlling the positions of the upper substrate and the lower substrate, and resultantly, obtaining of an image of the observation object in the entire directions is possible by positioning the local electric field at all regions of the observation object.

Also, at least one metal nanostructure may be positioned on the lower substrate, and the metal nanostructure may be easily assembled to the lower substrate or may be separated from the lower substrate.

Therefore, according to embodiments of the present invention, a user may obtain an image of the observation object by positioning the plurality of metal nanostructures of various shapes on the lower substrate according to an observation object or an observation condition. In addition, the plurality of metal nanostructures may be positioned on the lower substrate, thereby reducing the inconvenience of having to replace the metal nanostructure.

Figure 2:
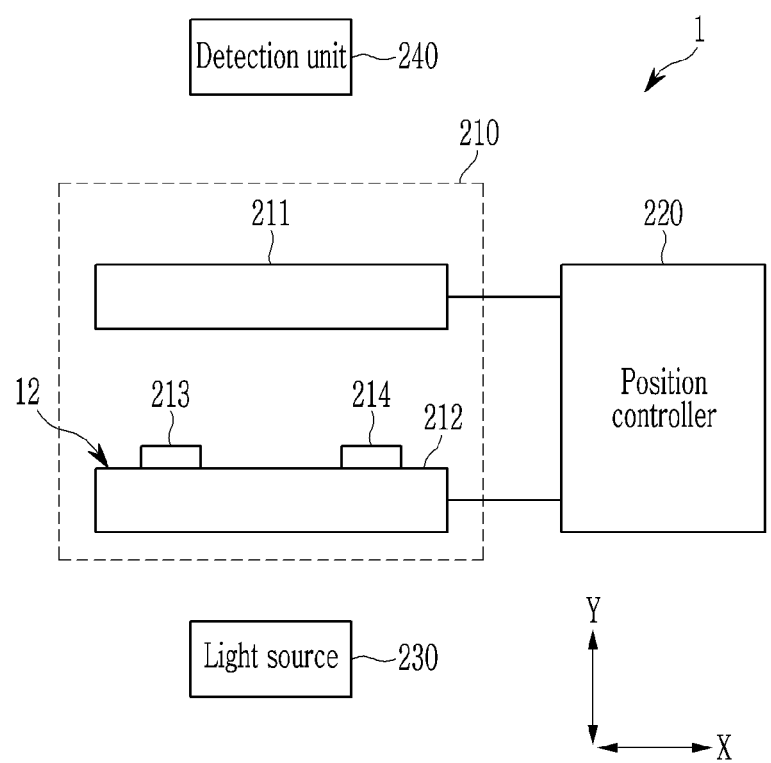
FIG. 2 is a side view to explain an optical image apparatus according to an exemplary embodiment of the present invention.

FIG. 2 is a side view to explain an optical image apparatus 1 according to an exemplary embodiment of the present invention.

Referring to FIG. 2, an optical image apparatus 1 according to an exemplary embodiment of the present invention includes a substrate unit of a nanostructure assembly type 210, a position controller 220, and a light source 230.

The substrate unit of the nanostructure assembly type 210 includes an upper substrate 211 on which the observation object may be positioned and a lower substrate 212 separated from the upper substrate 211. One or more metal nanostructures 213 and 214 may be positioned on the lower substrate 212.

The metal nanostructures 213 and 214 may be in a form such as a nanocolumn, a nanohole, and a nanoisland, and may be manufactured of a metal such as gold, silver, and aluminum. The local electric field of different patterns from each other may be formed depending on the shape of the metal nanostructures 213 and 214.

The metal nanostructures 213 and 214 may be assembled to the lower substrate 212 or may be separated from the lower substrate 212. A means for assembly or separation of the metal nanostructures 213 and 214 may be formed at the lower substrate 212, or the metal nanostructures 213 and 214 may be assembled on or separated from the lower substrate 212 in a way like attaching to or detaching from the lower substrate 212 without additional means for assembly and separation.

The lower substrate 212 is preferably made of a transparent material so that incident light passes therethrough to form a local electric field by the metal nanostructures 213 and 214. For example, the lower substrate 212 may be a dielectric material substrate such as glass as an exemplary embodiment.

The position controller 220 controls a relative position of the upper substrate 211 and the lower substrate 212 with each other. Here, the relative position may be the position in an X direction or the position in a Y direction. The X direction may be any one direction parallel to a main surface 12 such as an upper surface or a lower surface of the lower substrate 212 as shown in FIG. 2, and the Y direction may be the direction perpendicular to the main surface of the lower substrate 212. The position controller 220 may control the relative position of the upper substrate 211 and the lower substrate 212 with respect to each other using an actuator. According to an exemplary embodiment, the position controller 220 may move both of the upper substrate 211 and the lower substrate 212, or may move one of the upper substrate 211 and the lower substrate 212, to control the relative position in the X direction and the Y direction of the upper substrate 211 and the lower substrate 212 with respect to each other.

In detail, the position controller 220 may move at least one of the lower substrate 212 and the upper substrate 211 in the Y direction. For example, to easily perform replacement, assembly, or separation of the metal nanostructures 213 and 214 by the user, the position controller 220 may separate the upper substrate 211 and the lower substrate 212 from each other or may decrease the distance between the upper substrate 211 and the lower substrate 212 when imaging the observation object. In this case, because the observation object must be positioned within the depth of the local electric field to obtain an image of the observation object, the distance in the Y direction between the upper substrate 211 and the lower substrate 212 may be controlled to be within the depth range of the local electric field. The depth range of the local electric field may be variously set depending on an exemplary embodiment.

In addition, the position controller 220 may move at least one of the lower substrate 212 and the upper substrate 211 in the X direction. For example, when the plurality of metal nanostructures 213 and 214 are assembled on the lower substrate 212, and acquisition of the image is attempted by using different metal nanostructures 213 and 214 for the observation object, at least one of the lower substrate 212 and the upper substrate 211 may be moved in the X direction to position the observation object over the desired metal nanostructures 213 and 214. Further, to obtain an image for the entire region of the observation object with one metal nanostructure, the relative position of the observation object and the metal nanostructure with respect to each other in the X direction may be controlled.

The light source 230 may be positioned under the lower substrate 212 and provide incident light to the lower substrate 212.

The optical image apparatus 1 may further include a detection unit 240 for generating an image for the observation object. The detection unit 240 may be positioned on an opposite side to that of the light source 230 with respect to the substrate unit of the nanostructure assembly type 210. In addition, although not shown in the drawings, according to an exemplary embodiment, a light source adjustment system to change incident characteristics of the incident light from the light source 230, at least one lens positioned between the substrate unit of the nanostructure assembly type 210 and the detection unit 240, and a controller for controlling the optical image apparatus 1 may be further included.

Figure 3:
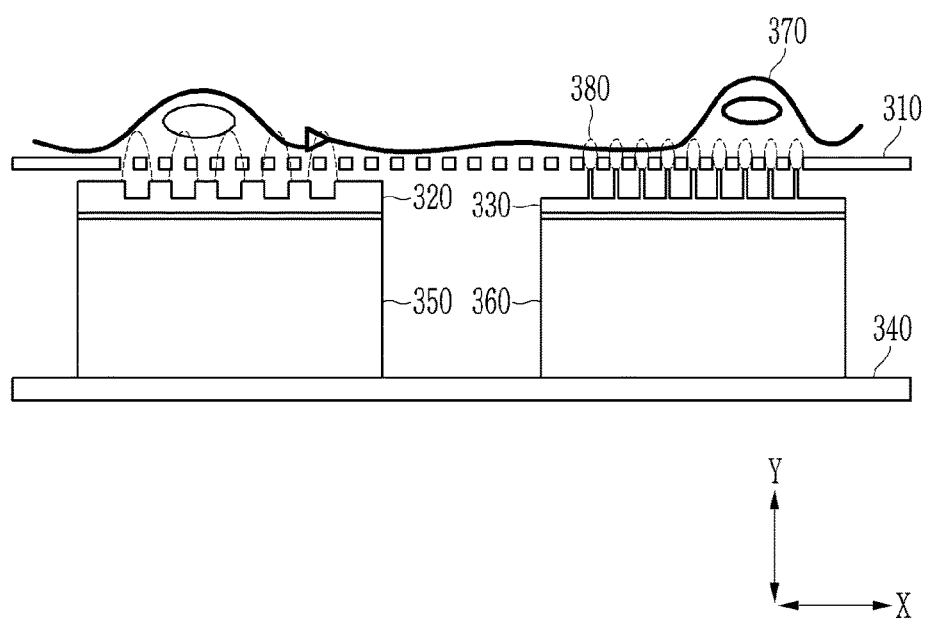
FIG. 3 is a side view showing a substrate unit of a nanostructure assembly type according to an exemplary embodiment of the present invention.
Figure 4A:
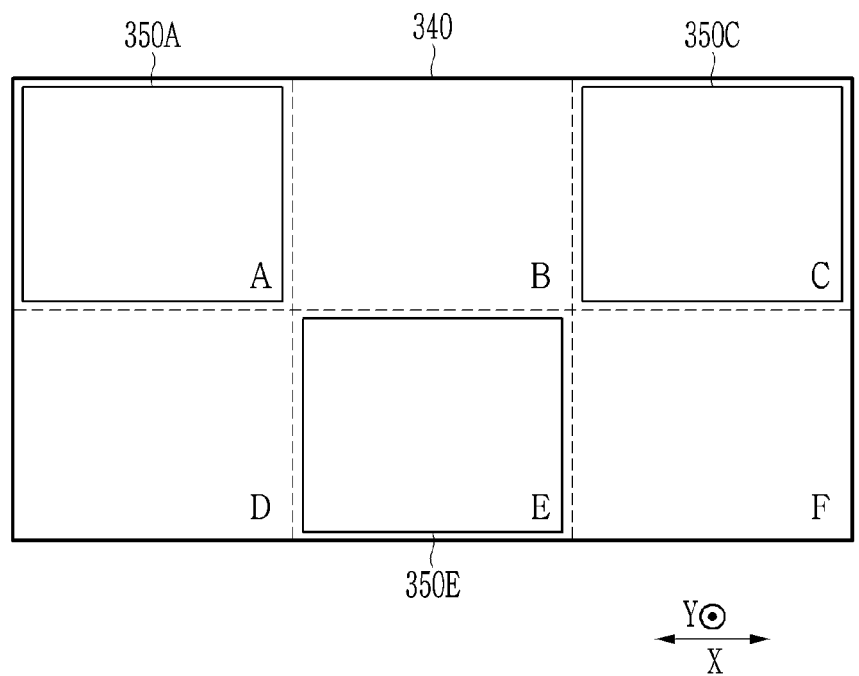
FIG. 4A and FIG. 4B are top plan views to explain a region where a metal nanostructure is positioned on a lower substrate according to an exemplary embodiment of the present invention.
Figure 4B:
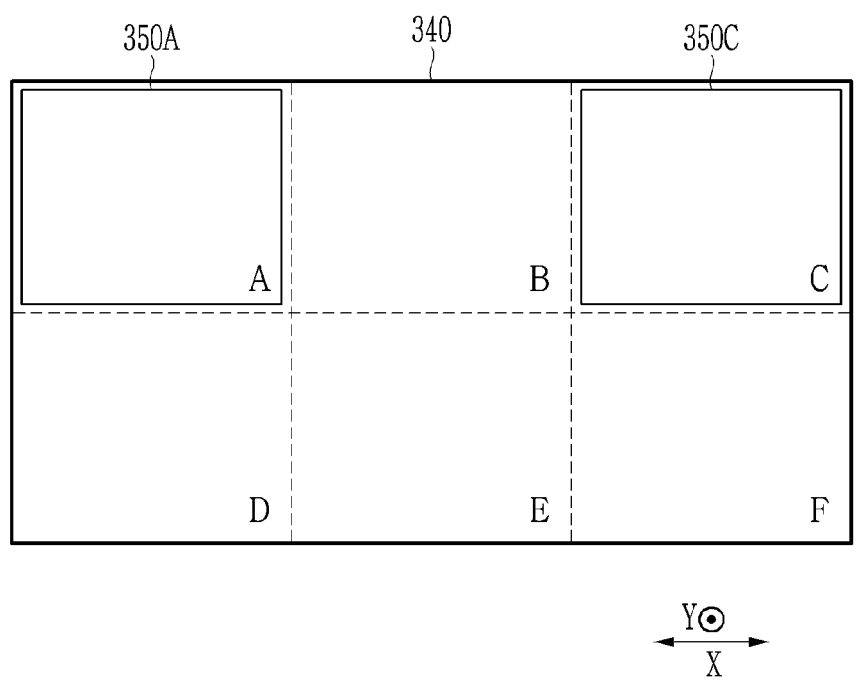

FIG. 3 is a side view showing a substrate unit of a nanostructure assembly type according to an exemplary embodiment of the present invention, and FIG. 4A and FIG. 4B are top plan views to explain a region where a metal nanostructure is positioned on a lower substrate according to an exemplary embodiment of the present invention.

FIG. 3 shows an exemplary embodiment in which a metal nanostructure 320 of a nanohole shape and a metal nanostructure 330 of a nanocolumn shape, as examples of the metal nanostructure, are positioned on the lower substrate 340, and a neuron, as an example of the observation object, is observed. According to another exemplary embodiment, the shape of the metal nanostructure may be changed. Unlike FIG. 3, one metal nanostructure or three or more metal nanostructures may be positioned on the lower substrate 340.

Referring to FIG. 3, the metal nanostructures 320 and 330 are positioned on the lower substrate 340, and particularly, each of the metal nanostructures 320 and 330 may be positioned on each of blocks 350 and 360 positioned on the lower substrate 340. That is, the blocks 350 and 360 respectively corresponding to the metal nanostructures 320 and 330 are positioned between each of the metal nanostructures 320 and 330 and the lower substrate 340. Each of the metal nanostructures 320 and 330 and each of the blocks 350 and 360 corresponding thereto may be attached to each other and assembled on the lower substrate 340 as one unit, or may be separated from the lower substrate 340. According to an exemplary embodiment, the metal nanostructures 320 and 330 may be positioned on the lower substrate 340 without the block.

As shown in FIG. 3, the metal nanostructures 320 and 330 may be separated from each other or may be positioned so as to be adjacent to each other. The distance between the adjacent metal nanostructures 320 and 330 may be appropriately controlled.

Referring to FIG. 4A and FIG. 4B along with FIG. 3, the main surface of the lower substrate 340 may be divided into a plurality of regions A-F allocated for each of the metal nanostructures 320 and 330. That is, the main surface of the lower substrate 340, on which the plurality of metal nanostructures may be positioned, may be divided into a plurality of regions A-F, and one region may be allocated for each of the metal nanostructures 320 and 330. A boundary between the allocation regions for the metal nanostructures may be represented by a dotted line so that the user may easily recognize the region allocated to the metal nanostructure to assemble the metal nanostructures 320 and 330 on the lower substrate 340. The plurality of regions A-F may be arranged approximately in a matrix shape as shown, but an arrangement thereof is not limited thereto.

The metal nanostructure may be positioned in at least a part among the plurality of regions A-F on the lower substrate 340. FIG. 4A shows an example in which metal nanostructures 350A, 350C, and 350E are respectively positioned in the regions A, C, and E among the plurality of regions A-F, and FIG. 4B shows an example in which the metal nanostructures 350A and 350C are respectively positioned in the regions A and C among the plurality of regions A-F, however it is not limited thereto, and according to another embodiment, the metal nanostructure may be positioned in each of the regions A-F. As above-described, if necessary, the metal nanostructures may be assembled or separated in the desired region on the lower substrate 340.

When the plurality of metal nanostructures are positioned on the lower substrate 340, the metal nanostructures may be separated from each other or may be adjacent to each other with respect to the boundary between the plurality of regions A-F on the lower substrate.

As described above, the position controller 220 shown in FIG. 2 may control the positions of an upper substrate 310 or the lower substrate 340 so that one among the plurality of regions A-F is positioned under and faces an observation object 370 according to the control signal.

Again referring to FIG. 3, a local electric field 380 formed by the metal nanostructures 320 and 330 overlaps the observation object 370 positioned on the upper substrate 310, and the phosphor included in the observation object 370 may emit the light by the local electric field.

Since the lower substrate 340 or the upper substrate 310 may be moved in the X direction or the Y direction (i.e., the transverse direction or the longitudinal direction) by a position controller, the position of the lower substrate 340 or the upper substrate 310 may be controlled so that the local electric field may overlap a region of the observation object 370 that has not overlapped the local electric field at an initial position of the lower substrate 340 and the upper substrate 310. That is, the scanning and image acquisition for the entire region of the observation object 370 are possible by moving at least one of the lower substrate 340 and the upper substrate 310 in the X direction.

By moving the lower substrate 340 or the upper substrate 310 in the X direction, an image of a specific region of the observation object 370 may be obtained by using the various metal nanostructures 320 and 330 for the specific region of the observation object 370. For example, by moving the lower substrate 340 shown in FIG. 3 in the right side or moving the upper substrate 310 in the left side, an image of a specific region of the observation object 370 may be secondarily obtained by the different metal nanostructure 320 for the specific region of the observation object 370 of which an image was firstly obtained by the metal nanostructure 330.

On the other hand, according to an exemplary embodiment, a nanohole of a smaller size than the nanostructure may be formed in the upper substrate 310. When the observation object 370 is a bio sample, an ion material included in the bio sample may pass the nanohole.

Figure 5:
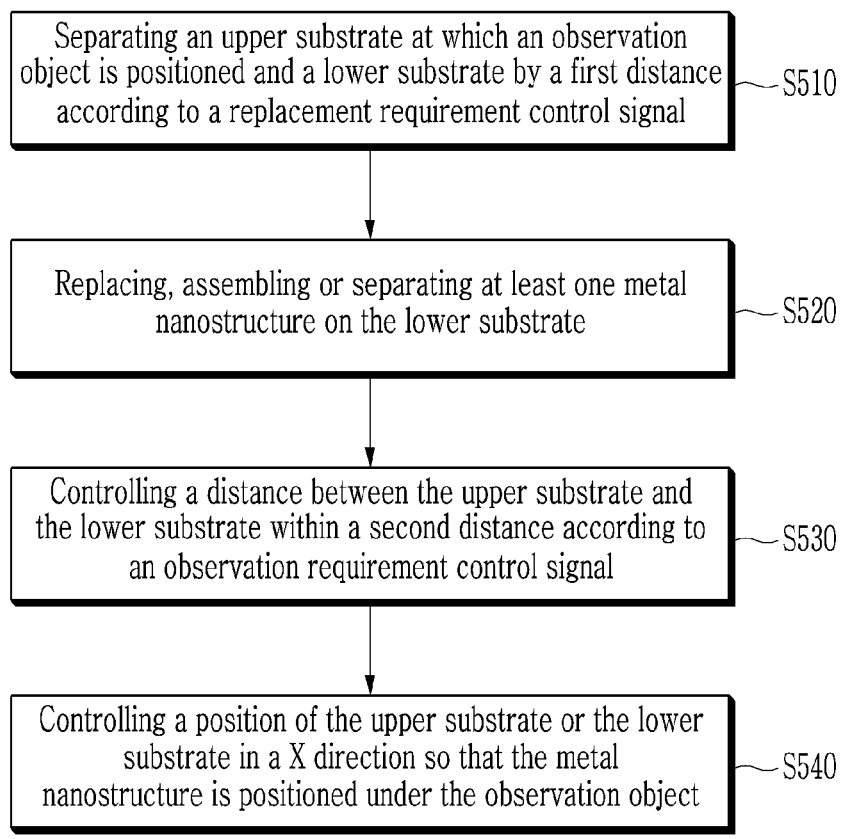
FIG. 5 is a flowchart to explain a method of controlling an optical image apparatus of a substrate unit of a nanostructure assembly type according to an exemplary embodiment of the present invention.

FIG. 5 is a flowchart to explain a method of controlling an optical image apparatus of a substrate unit of a nanostructure assembly type according to an exemplary embodiment of the present invention.

The optical image apparatus according to the present invention separates the upper substrate at which an observation object is disposed and the lower substrate from each other by a first distance according to a replacement requirement control signal (S510). At least one metal nanostructure may be positioned on the lower substrate, and in this case, the upper substrate and the lower substrate may be separated by the first distance so that the user may easily assemble or replace the metal nanostructure to or from the lower substrate.

Next, in the state that the lower substrate and the upper substrate are separated from each other by the first distance, at least one metal nanostructure may be assembled to the corresponding region on the lower substrate, or the metal nanostructure that is already used may be separated or replaced (S520).

Next, according to the observation requirement control signal, the distance between the upper substrate and the lower substrate is controlled within a second distance (including the second distance) smaller than the first distance (S530). The observation requirement control signal is the image acquisition requirement signal for the observation object, and the second distance may be determined depending on the depth of the hot spot, that is the local electric field, formed by the metal nanostructure.

The replacement requirement control signal and the observation requirement control signal may be generated in the above-described controller or may be input to the optical image apparatus from an external apparatus.

The optical image apparatus may control the position of the upper substrate or the lower substrate according to the observation requirement control signal so that one among at least one metal nanostructure is positioned under the observation object (S540). In this case, the position in the X direction of at least one of the lower substrate and upper substrate may be controlled.

Referring to FIG. 4A and FIG. 4B, when the metal nanostructures are positioned in the allocation regions A, C, and E, respectively, the optical image apparatus may control the position of the upper substrate or the lower substrate so that each of the allocation regions A, C, and E may be sequentially positioned under the observation object. In this case, the observation object may also be positioned at the upper substrate to correspond to the allocation region of the lower substrate.

When the size of the observation object is larger than each allocation region on the lower substrate, the optical image apparatus may control the position of the upper substrate or the lower substrate so that the metal nanostructure is disposed aligned to the center of the observation object.

The optical image apparatus may move the upper substrate or the lower substrate with a predetermined pattern after the metal nanostructure is positioned under the observation object for scanning the entire region of the observation object. For example, the optical image apparatus may perform the scanning for the entire region of the observation object while moving the lower substrate with a zigzag pattern on a surface perpendicular to the Y direction in the state that the position of the upper substrate is fixed.

According to the present invention, because the position of the local electric field formed at the observation object is controlled by controlling the positions of the upper substrate and the lower substrate while the observation object is not directly positioned on the metal nanostructure, the image acquisition for the entire region of the observation object is possible by positioning the local electric field to the entire region of the observation object. According to the present invention, because at least one metal nanostructure may be separated from or assembled on the lower substrate, the user may obtain an image for the observation object by positioning a plurality of metal nanostructures of various shapes on the lower substrate according to the observation object or the observation condition. Further, inconvenient replacement of the metal nanostructure is not required as the plurality of metal nanostructures may be positioned on the lower substrate.

The above-described technical contents may be realized as a program instruction format executable by various computer means and may be recorded on a computer readable medium. The computer readable medium may include program instructions, file data, and data structures, or combinations thereof. The program instructions recorded on the medium may be those that are designed and configured for the present invention, or those that are known to a person of ordinary skill in the art of computer software and are usable. Examples of the computer readable medium include magnetic media such as a hard disk drive, a floppy disk, or a magnetic tape, optical media such as a CD-ROM or a DVD, magneto-optical media such as a floptical disk, and a hardware device specially configured to store and execute program instructions such as a ROM, a RAM, or a flash memory. Examples of the program instructions include high-level language codes executable by a computer by using an interpreter in addition to machine language codes generated by a compiler. The hardware device can be configured to be operable as at least one software module for performing an operation of the present invention.

As described above, the present invention has been described by specific matters such as specific constituent elements and limited examples and drawings, which are only provided to aid in a more general understanding of the present invention, but the present invention is not limited to the above examples, and a person having ordinary knowledge in the field to which the present invention belongs can make various amendments and modifications from such description. Therefore, the spirit of the present invention is not limited to the embodiment described, and not only the scope of the claims that will be described later but all those equivalent to or equivalent modifications of the claims are considered to fall within the scope of the spirit of the present invention.

What is claimed is:

1. A substrate unit of a nanostructure assembly type comprising:
   a lower substrate;
   an upper substrate separated from the lower substrate, an observation object being able to be positioned at the upper substrate; and
   at least one metal nanostructure positioned on the lower substrate,
   wherein the at least one metal nanostructure is capable of being assembled on the lower substrate or separated from the lower substrate.

2. The substrate unit of the nanostructure assembly type of claim 1, further comprising
   at least one block positioned between each of the at least one metal nanostructure and the lower substrate, the at least one block capable of being separated from the lower substrate or assembled to the lower substrate along with the metal nanostructure.

3. The substrate unit of the nanostructure assembly type of claim 1, wherein
   a main surface of the lower substrate is divided into a plurality of regions, and
   each of the at least one metal nanostructure is positioned in each different region of the plurality of regions.

4. The substrate unit of the nanostructure assembly type of claim 3, wherein
   the plurality of regions are arranged in a matrix shape.

5. The substrate unit of the nanostructure assembly type of claim 3, wherein
   the at least one metal nanostructure is provided in a plurality of metal nanostructures, and
   different metal nanostructures among the plurality of metal nanostructures are separated from each other on the lower substrate.

6. The substrate unit of the nanostructure assembly type of claim 1, wherein
   a relative position between the upper substrate and the lower substrate is controllable.

7. An optical image apparatus comprising:
   a lower substrate including a main surface perpendicular to a first direction;
   an upper substrate separated from the lower substrate, an observation object being able to be positioned at the upper substrate;
   at least one metal nanostructure positioned on the lower substrate;
   a position controller for controlling at least one position of the upper substrate and the lower substrate; and a light source positioned under the lower substrate and for irradiating light to the lower substrate, wherein the position controller controls a position of at least one of the lower substrate and the upper substrate in a second direction perpendicular to the first direction.

8. The optical image apparatus of claim 7, wherein the at least one metal nanostructure is capable of being assembled on the lower substrate or separated from the lower substrate.

9. The optical image apparatus of claim 7, wherein the position controller is capable of controlling a distance between the upper substrate and the lower substrate in the first direction within a depth range of a local electric field formed by the metal nanostructure.

10. The optical image apparatus of claim 7, wherein a main surface of the lower substrate is divided in a plurality of regions, and each of the at least one metal nanostructure is positioned in each different region of the plurality of regions.

11. The optical image apparatus of claim 10, wherein the plurality of regions are arranged in a matrix shape.

12. The optical image apparatus of claim 10, wherein the at least one metal nanostructure is provided in a plurality of metal nanostructures, and different metal nanostructures among the plurality of metal nanostructures are separated from each other on the lower substrate.

13. The optical image apparatus of claim 10, wherein the position controller controls a position of the upper substrate or the lower substrate according to a control signal so that one among the plurality of regions faces the observation object.

14. The optical image apparatus of claim 7, further comprising at least one block positioned between the at least one metal nanostructure and the lower substrate, the at least one block capable of being separated from the lower substrate or assembled to the lower substrate along with the at least one metal nanostructure.

15. A controlling method of an optical image apparatus including a lower substrate, an upper substrate, and a position controller, the method comprising:

separating the upper substrate at which an observation object is positioned and the lower substrate from each other by a first distance according to a replacement requirement control signal;

assembling or separating at least one metal nanostructure on or from the lower substrate; and controlling a distance between the upper substrate and the lower substrate within a second distance smaller than the first distance according to an observation requirement control signal, wherein the second distance is determined depending on a depth of a local electric field formed by the at least one metal nanostructure.

16. The controlling method of claim 15, further comprising controlling a position of the upper substrate or the lower substrate according to the observation requirement control signal so that one among the at least one metal nanostructure is positioned under the observation object.

* * * * *